United States Patent
Tanaka et al.

(10) Patent No.: US 7,355,211 B2
(45) Date of Patent: Apr. 8, 2008

(54) LIGHT-EMITTING ELEMENT AND DISPLAY THEREOF

(75) Inventors: Toshiaki Tanaka, Kodaira (JP); Hiroshi Sasaki, Mito (JP); Hajime Murakami, Tomobe (JP); Masao Shimizu, Hitachi (JP); Ikuo Hiyama, Hitachinaka (JP)

(73) Assignee: Hitachi Displays, Ltd., Chiba (JP)

( * ) Notice: Subject to any disclaimer, the term of this patent is extended or adjusted under 35 U.S.C. 154(b) by 0 days.

(21) Appl. No.: 11/099,233

(22) Filed: Apr. 4, 2005

(65) Prior Publication Data

US 2005/0231106 A1  Oct. 20, 2005

(30) Foreign Application Priority Data

Apr. 7, 2004  (JP)  ............................. 2004-112634

(51) Int. Cl.
*G02B 1/10* (2006.01)
(52) U.S. Cl. .................. 257/98; 313/503; 257/E51.028; 257/E51.03; 257/E51.031; 257/E51.044; 257/E51.051
(58) Field of Classification Search .................. 257/98; 313/503, 504, 506
See application file for complete search history.

(56) References Cited

U.S. PATENT DOCUMENTS

| 6,023,128 | A | * | 2/2000 | Grothe et al. | ................ | 313/506 |
| 2003/0116719 | A1 | * | 6/2003 | Miyazawa | ................ | 250/484.2 |
| 2004/0253427 | A1 | * | 12/2004 | Yokogawa et al. | ......... | 313/506 |
| 2005/0194896 | A1 | * | 9/2005 | Sugita et al. | ................ | 313/506 |

FOREIGN PATENT DOCUMENTS

| JP | 2001-202827 | 7/2001 |
| JP | 2003-201443 | 7/2003 |
| WO | WO 2004/004422 | * 1/2004 |

OTHER PUBLICATIONS

Yong-Jae Lee et al., "A high-extraction-efficiency nanopatterned organic light-emitting diode", Appl. Phys. Letter 82, pp. 3779-3781, 2003.
Hiroshi Yokogawa, 9th Symposium, "Molecular Electronics and Bioelectronics", JSAP, 2001.
Technology and prospect of LED backlight loaded in liquid crystal TV first in the world, by Sony Corporation, 2005.
U.S. Appl. No. 11/070,123, filed Mar. 1, 2005.

* cited by examiner

Primary Examiner—A. Sefer
(74) Attorney, Agent, or Firm—Hogan & Hartson LLP

(57) ABSTRACT

Conventional light-emitting elements, in particular an organic electroluminescence devices, involve problems resulting from a low light extraction efficiency of 20% or less, because of limitations on light emission set by total reflection angle on an organic layer or transparent electrode as the component, and are demanded to have improved luminance and other optical characteristics which depend on viewing angle. The present invention provides an organic electroluminescence device which can improve a light extraction efficiency and thereby reduce operational current and power consumption by incorporating a laminate of optical thin films of low refractive index and having pores whose size is controlled at a level equivalent to or shorter than visible wavelengths, because the light components totally reflected to become wave-guided or reflected light in a common device can be extracted as light scattered by the pores.

11 Claims, 11 Drawing Sheets

- ● PORE-FREE SILICA
- ○ PORE-CONTAINING SILICA

FIG.21 ed element spontaneously emitting light, an organic electroluminescence device, in which electroluminescence (EL) emitted by an organic compound material is utilized, has been expected to find various practical purposes. At present, however, conventional organic electroluminescence devices are low in a light extraction efficiency at 20% or less, and need specific measures to improve the efficiency. Therefore, submicron- or nanometer-size microstructures have been proposed to improve light extraction efficiency of organic electroluminescence devices. Some of these proposals are described below.

BACKGROUND OF THE INVENTION

For example, prior arts of Patent Documents 1 and 2 discuss that aerogel containing 3 to 10 nm thick silica particles and pores of the order of 10 to 50 nm in size, when included between a board and light-emitting layer in an organic electroluminescence device, increases photoluminescence intensity and current efficiency of the element almost 2 times and 1.6 times, respectively. Prior art of Non-patent Document 1 discusses that aerogel, when included between a thin-film transistor board and transparent electrode in an organic electroluminescence device, increases current efficiency of the device by almost 60%.

Another prior art of non-patent Document 2 discloses an attempt to improve light extraction efficiency of an organic electroluminescence device based on a photonic crystal layer with a silicon nitride (SiN) film provided on a glass board and below a transparent electrode, and 7 to 400 nm deep patterns provided in the interface between the glass board and SiN film at intervals of 200 to 900 nm. It discusses that increasing depth of the pattern grooves can improve its light extraction efficiency by up to 50%.

Patent Document 1: JP-A-2001-202827

Patent Document 2: JP-A-2003-201443

Non-patent Document 1: Hiroshi Yokogawa, 9th Symposium, Organic Molecules and Bioelectronics Section, JSAP, 2001

Non-patent Document 2: Yong-Jae Lee, et. al, Appl. Phys. Lett., 82, 3779 (2003)

BRIEF SUMMARY OF THE INVENTION

Conventional light-emitting elements involve problems of decreased proportion of light emitted to the outside, because light emitted from a light-emitting layer partly turns into reflected light or light of guided wave, resulting from limitations set by total reflection angle on the plane from which light is emitted. As disclosed by the above documents, the submicron- or nanometer-size microstructures have been studied to improve light extraction efficiency of organic electroluminescence devices. It is however hard to say that these techniques have realized the sufficient effects. Moreover, these techniques need special processes and sophisticated, precision controlling techniques, are hard to stably secure sufficient refractive index, diffraction intensity and scattering intensity, and should be improved with respect to stability and controllability of light-emitting intensity at the plane from which light is emitted. Viewed from production technology, in particular, they are low in productivity resulting from insufficient throughputs, and are considered to leave much to be improved.

The inventors of the present invention have developed, based on novel techniques, an optical thin film highly efficient and stably controllable for light extraction, simple in structure and applicable to production techniques, and attempted to solve the above problems by utilizing its functions and characteristics. It is an object of the present invention to provide an organic electroluminescence device which uses the optical thin film of low refractive index and capable of being produced simply from commercial starting materials, in order to improve its light extraction efficiency and, at the same time, to improve its light-emitting efficiency and reduce the required operational current and power consumption as a result of the improved light extraction efficiency.

Described hereunder are the optical thin film of low refractive index incorporated in the organic electroluminescence device of the present invention, and procedures for improving light extraction efficiency of the device and reducing the required operational current and power consumption.

Figure 1:
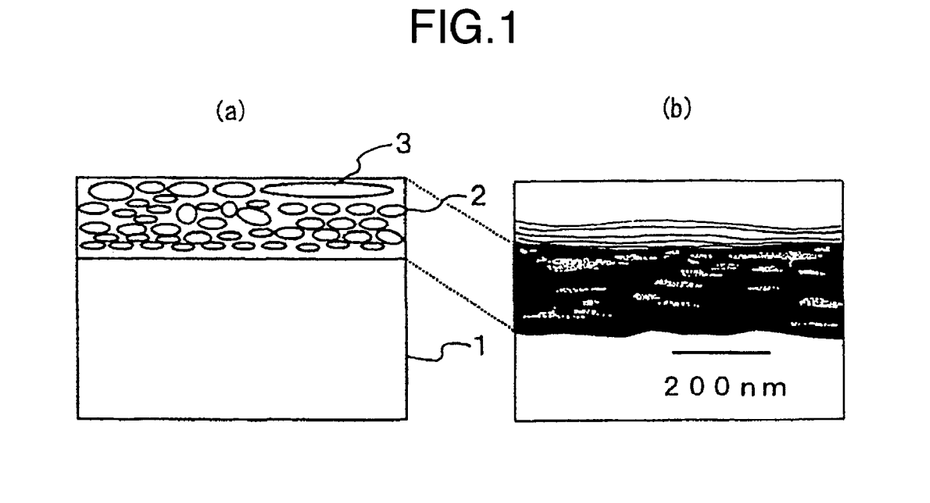
FIG. 1(a) outlines the cross-section of an optical thin film of low refractive index provided on a board for the present invention.
FIG. 1(b) presents a schematic diagram of a scanning electron microgram showing the cross-sectional structure of the optical thin film of low refractive index for the present invention.

First, the optical thin film of low refractive index incorporated in the present invention is described. FIG. 1(a) outlines a cross-section of the optical thin film provided on a glass board for the present invention. FIG. 1(b) presents a schematic diagram of a photograph observed by a scanning electron microscope (SEM) of the actual cross-sectional structure. The optical thin film for the present invention was prepared by a procedure which used silica-dispersed sol, colloidal silica and alcohol as the starting materials for the film. As shown in FIGS. 1(a) and (b), it is found that the procedure for the present invention can produce the optical thin film composed of a dielectric material as the base material which contains nanometer-size pores having a nanometer-order thickness. It is also found that proportion of the nanometer-size pores gradually increases upwards to the surface, and that their size also increases upwards to the surface. The electron microscopic analysis, carried out selectively for the pore inside, detected carbon (C), oxygen (O) and hydrogen (H) derived from the alcohol in the pores, and only silicon (Si) and oxygen (O) derived from silica ($SiO_2$) around the pores.

Figure 2:
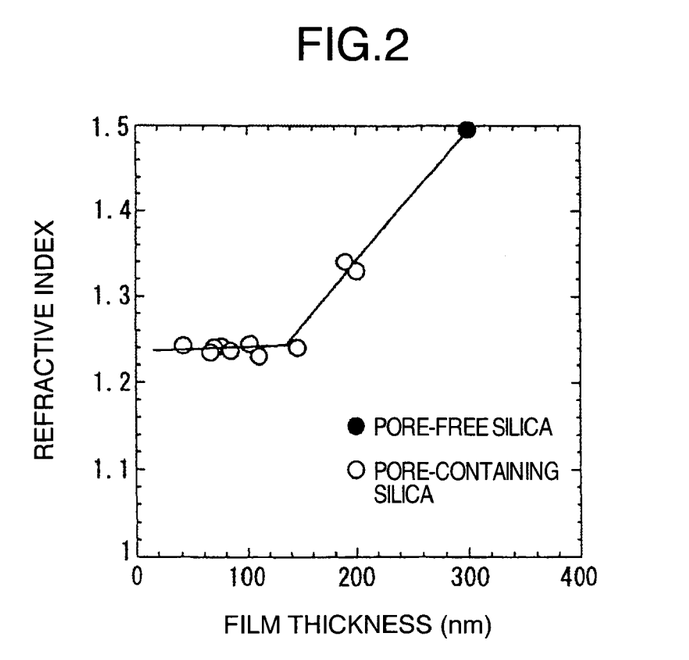
FIG. 2 shows the relationship between refractive index and thickness of the optical thin film of low refractive index for the present invention.

The average refractive index of the film as a whole can be set at a level lower than that of the dielectric material as the base by controlling film thickness, or proportion or size of the pores. The film has an average refractive index lower than that of silica by itself, as revealed by an optical analysis. It can be changed in a range from 1.09 to 1.5 (refractive index of film of solid silica) by controlling the film-making conditions. FIG. 2 shows the relationship between refractive index and thickness of the optical thin film, prepared under certain conditions, where these properties were determined by ellipsometry. The film prepared to be pore-free, i.e., solid silica film, had a refractive index of 1.5. It is found that refractive index of the film can decrease as its thickness decreases by forming nanometer-size pores in the film and controlling its thickness. It is also found, however, that it has a tendency that a refractive index does not lower and no longer depends significantly on thickness even when the film thickness decreases to below a certain level. As illustrated in FIG. 2, the film prepared under specific conditions shows limited dependence on thickness when it is 140 to 150 nm or below. This conceivably results from the pores distributed throughout the film to leave little changes in pore proportion and hence in refractive index. The film shown in FIG. 2 has a refractive index controlled almost constant at 1.22 to 1.26 essentially irrespective of film thickness when it is 140 nm or below, indicating that film thickness is an important parameter for controlling refractive index of an optical thin film.

The detailed analysis of the electron micrograph for the pore distribution indicates that both proportion and size of the pores increase towards the upper region near the surface, by which is meant that a refractive index distribution in which it decreases in the thickness direction can be realized, although the average refractive index of the film as a whole is determined by its thickness. In other words, the film can have a refractive index distribution in which it smoothly changes in the thickness direction, and the distribution can be controlled by the film-making conditions to control film thickness and pore proportion. That the distribution of smoothly changing refractive index in the thickness direction can be realized in an optical thin film means that the film can transmit light without greatly decaying its transmittance, because of lack of the interface which massively receives light while it is transmitting light. Therefore, the optical thin film for the present invention, in which proportion of the pores gradually changes in the thickness direction and increases towards the surface, provides important effects of realizing a smooth distribution of refractive index, tapering off the proportion towards the surface and, at the same time, giving a high scattering light intensity in the vicinity of the surface. Moreover, the optical thin film for the present invention, when formed on a glass board, can keep a refractive index difference low between the film and board at their interface to minimize reflection-caused loss, because the region essentially free of the pores serves as the interface.

Moreover, shape and size of the pores are widely varying in the optical thin film, with spherical to flat, elliptic shapes randomly distributed, as observed by an electron microscope. Size of the pores is almost in a range from 50 to 400 nm, which corresponds to, or is shorter than, a wavelength of bluish purple color in visible light (wavelength: 400 to 700 nm), i.e. which is less than or about a visible light wavelength. When the pores of the above size transmit light, Mie scattering, which occurs when light hits an object having a size of light wavelength, can be utilized. The optical thin film for the present invention is structurally characterized by the pores whose size is controlled to positively utilize the conditions under which scattering of visible light wavelengths of transmitted light (i.e., Mie scattering) occurs.

The organic electroluminescence device of the present invention is structured to enhance light extraction efficiency, i.e., to emit light from the light-emitting layer in the device to the outside as far as possible. In order to emit light to the outside, it is necessary to keep angle of incident light on the plane from which light is emitted smaller than total reflection angle. According to classic optics, even a light component which cannot be emitted to the outside, because it is kept at an angle equal to or larger than total reflection angle as a result of common light reflection, can have a decreased incident angle on the plane, when light scattered by the pores in the optical thin film is utilized. Therefore, light scattering at the pores can increase light components which can be emitted to the outside. The intensity distribution of Mie scattering light is characterized by a radial pattern, with light scattered after it hits an object greatly extending it the radial directions. Therefore, it is considered to be more advantageous with respect to light extraction efficiency than light scattered after it hits an object smaller than light wavelengths, i.e., Rayleigh scattering light, whose intensity distribution is characterized by a spherical pattern.

It is necessary, when incident light hits an object, to minimize reflection or loss of Mie scattering light. In order to avoid reflection or decay of light as far as possible and thereby to keep scattered light intensity at a high level, an object having a light wavelength size is needed for the scattered light distribution, although a suitable size is in a limited range. The object preferably has a size smaller than light wavelengths to avoid reflection or decay of light. When size of the object is considered to an extent of around half of light wavelength as a measure to prevent reflection or decay of light from occurring greatly, it will be in a range from 50 nm (which is a demarcation wavelength between Mie scattering and Rayleigh scattering) to around half of incident light wavelength, in order to effectively utilize Mie scattering light. The above discussion leads to a conclusion that nanometer-size of the pores to be introduced into the optical thin film for the present invention is in a range from about 50 to 200 nm for visible light wavelengths.

Next, significance of utilizing light scattering for light extraction efficiency of a light-emitting element is described. Referring to FIG. 3(a), when the glass board 4 is regarded as the plane from which light is emitted, the critical angle $\theta_c$, at an incident light angle above which no light can be emitted to the outside, is given by the formula $\theta_c = \sin^{-1}(1/n_{glass})$, where $n_{glass}$ is refractive index of the glass board and that of air is assumed to be 1. This means that emission of light to the outside is limited by the critical angle on the plane. Light extraction efficiency can be estimated from solid angle of light emitted from the plane at the critical angle. More specifically, light emitted from the plane at the critical angle has a solid angle given by the formula $2\pi(1-\cos\theta_{st})$, where $\theta_{st}$ is angle at which light is emitted from a light-emitting point in the organic layer 7, when light reaches the point after being transmitted by the optical thin film 5 as a layer of low refractive index and transparent electrode 6. Therefore, its light extraction efficiency $\eta_{ext}$ is given by the formula $\eta_{ext}=1-\cos\theta_{st}$. The efficiency remains unchanged even in the presence of the optical thin film 5 of low refractive index, because reflection of light in a film is determined only by its refractive index, as taught by classic optics.

Figure 3:
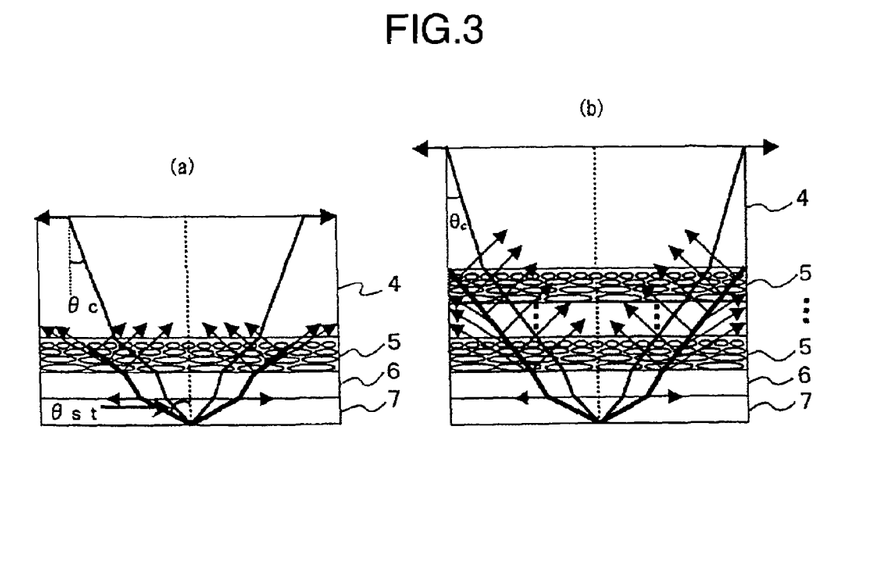
FIG. 3(a) shows one example of the cross-section of the organic light-emitting device of the present invention, incorporated with the optical thin film, and traces of light emitted from a light-emitting point.
FIG. 3(b) shows another example of the cross-section of the organic light-emitting device of the present invention, incorporated with the optical thin film, and traces of light emitted from a light-emitting point.

On the other hand, the optical thin film 5 for the present invention, illustrated in FIG. 3, is not only of a low refractive index layer but also has nanometer-size pores, which is equivalent to or shorter than visible light wavelengths, and can emit Mie scattering light to the outside. The pore region in the optical thin film 5, illustrated in FIG. 3, scatters incident light entering at an angle lager than the incident angle determined by the glass board plane from which light is emitted, thus changing incident angle in practice. Consequently, part of scattered light can be emitted from the plane to the outside as the light component having an incident light angle smaller than the critical angle. The pore region in the optical thin film 5 can scatter a light to enhance a light extraction efficiency and hence expands a solid angle effective for a light extraction. This shows that a solid angle $\theta_{st}$ contributive to a light extraction can be made larger to be able to make a light extraction efficiency $\eta_{ext}$ $(1-\cos\theta_{st})$ larger. The above discussion can explain the improved light extraction efficiency of the present invention by introducing the optical thin film having nanometer-size pores.

The optical thin film for the present invention has a nanometer-order thickness. However, they may be stacked in layers to have a micron-order thickness. It is possible, by stacking the optical thin films 5 to have a thicker film, to control refractive index of the film as a whole or to set thickness of the low refractive index layer for specific purposes, because of increased thickness of the pore region, as illustrated in FIG. 3(b). It is also applicable when the thicker region for utilizing scattered light is needed. Stacking the films, therefore, allows the optical thin film for the present invention for specific purposes. The resulting film can be controlled to have a desired refractive index or thickness, and is highly versatile.

Figure 4:
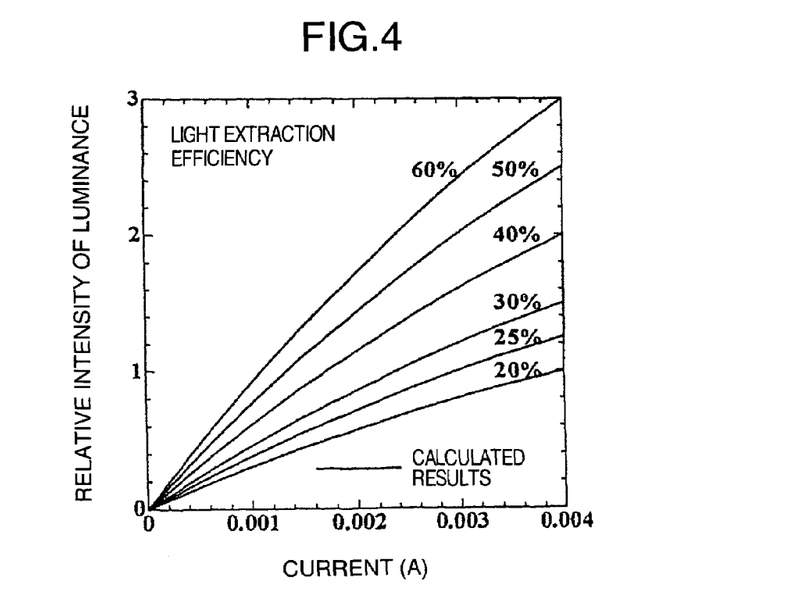
FIG. 4 shows the calculated relative luminance-current characteristics with light extraction efficiency as a parameter.
Figure 5:
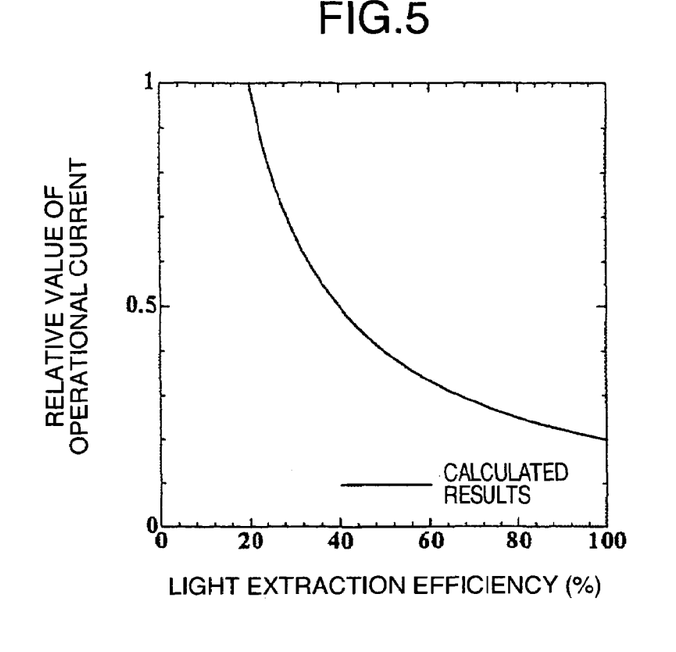
FIG. 5 shows the calculated relationship between relative operational current and light extraction efficiency.
Figure 6:
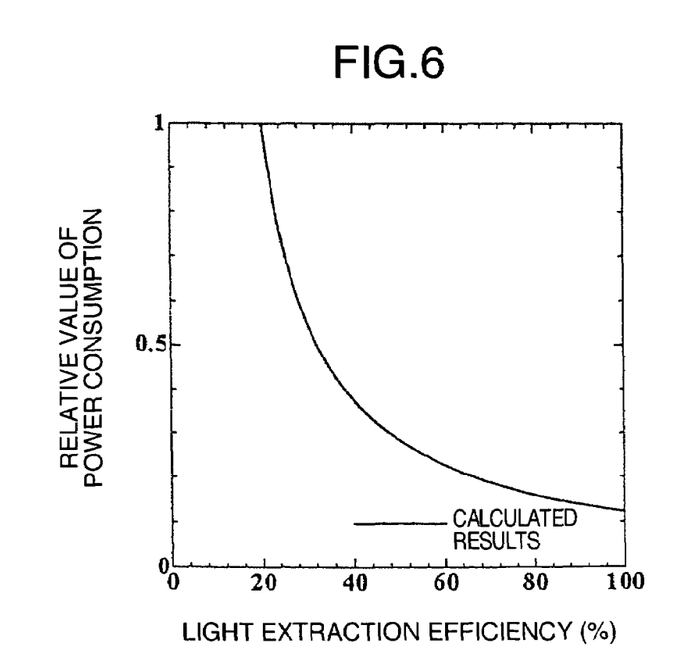
FIG. 6 shows the calculated relationship between relative power consumption and light extraction efficiency.

As discussed above, the light-emitting element of the present invention, incorporated with the stacked optical thin films, is characterized by improved light extraction efficiency brought by the nanometer-size pores which utilize Mie scattering light of visible wavelengths. The improved light extraction efficiency leads to emission of light of high luminance at a reduced current or voltage. FIGS. 4 to 6 show the quantitatively calculated results, FIG. 4 plotting relative luminance intensity against operational current with light extraction efficiency as a parameter, FIG. 5 plotting relative current against light extraction efficiency, and FIG. 6 plotting relative power consumption against light extraction efficiency. FIG. 4 shows the luminance-current characteristics, illustrating to what extent the characteristics can be improved by increasing light extraction efficiency from 20% as the base. Doubling a light extraction efficiency of 20%, which is a level of a common organic electroluminescence device, to 40% and tripling to 60% doubles and triples luminance at the same current, respectively. Doubling a light extraction efficiency of 20% to 40% and tripling to 60% reduce required current to half and one-third at the same luminance, respectively, as illustrated in FIG. 5. Doubling a light extraction efficiency of 20% to 40% and tripling to 60% reduce power consumption to around one-third and one-fourth, respectively, as illustrated in FIG. 6. Therefore, improving light extraction efficiency not only improves luminance but also reduces device operational current or voltage, and contributes to reduced power consumption of the display as a whole.

Moreover, the optical thin film for the present invention is highly moisture-absorptive and efficiently absorbs moisture from the surface, and exhibits a function of gettering moisture in an atmosphere for sealing the organic electroluminescence device. A common insulating film has a high surface resistivity of $10^{15}$ to $10^{16}$ $\Omega/cm^2$. Therefore, charges of the ionic molecules which it absorbs tend to accumulate locally, and concentration of the ions which can be absorbed tends to be saturated in that region. By contrast, the optical thin film for the present invention is found to be highly antistatic, because of its low surface resistivity of $10^{10}$ to $10^{11}$ $\Omega/cm^2$. It prevents local accumulation of charges to keep a high ion saturation concentration, because of prevented local accumulation of the ionic molecules adsorbed, which is another characteristic of the thin film. Therefore, the optical thin film for the present invention exhibits an effect of preventing deterioration of an organic film and electrode, which are sensitive to moisture or the like, and can be said to be a film of high resistance to ambient conditions. As such, it can play an important role for securing reliability of the device in which it is used.

As discussed above, the optical thin film can realize a light-emitting element and display, high in efficiency and reliability, and stably serviceable for extended periods.

The means for solving the problems include the followings:

The first means is a light-emitting element comprising:
 a board;
 a first electrode;
 a second electrode;
 a light-emitting layer placed between the first electrode and second electrodes; and
 an optical thin film,
 wherein the optical thin film is composed of a dielectric material as a base material and has a pore, of which proportion based on the optical thin film is changing in a film thickness direction of the optical thin film. The first and second electrodes constitute a pair of electrodes holding the light-emitting layer in-between.

Another means is the above-described light-emitting element wherein the optical thin film has a refractive index distribution in the thickness direction, or wherein the pores have a size of a major axis changing in the thickness direction of the optical thin film and the size of the major axis increases towards a plane from which a light is emitted from the optical thin film. The "plane from which a light is emitted" (i.e., a light extraction plane) is the one from which a light radiated from the light-emitting layer is emitted to the outside, by which is meant that it is the uppermost surface of the light-emitting element in contact with air. The size of the major axis of the pore means nearly the longest diameter of the pore.

Still another means is the above-described light-emitting element wherein the pores have a major axis running in parallel to a plane from which a light is emitted from the optical thin film, and a length of the major axis increases in the thickness direction towards the plane.

Still another means is the above-described light-emitting element wherein the optical thin film has a surface resistivity of $10^{10}$ to $10^{11}$ $\Omega/cm^2$, inclusive.

Still another means is the above-described light-emitting element wherein the pores have a diameter of 5 to 700 nm, inclusive, and are structured to emit a light due to Mie scattering, which is generated when a light emitted from the light-emitting layer hits the pores, to an outside of the element.

Still another means is the above-described light-emitting element wherein a thickness of the optical thin film is half or less of a peak wavelength of visible light transmitted by the film.

Still another means is the above-described light-emitting element wherein the optical thin film is composed of plural films stacked in layers, each layer having a thickness of 10 to 700 nm, inclusive.

Still another means is the above-described light-emitting element which is composed of an organic material, e.g., an organic low-molecular-weight or high-molecular-weight material, and contains the optical thin film stacked towards a light extraction plane of the light-emitting layer, from which electroluminescence is emitted.

Still another means is the above-described light-emitting element wherein the first electrode or the second electrode is transparent electrode and is provided in contact with the optical thin film.

Still another means is the above-described light-emitting element, wherein a sealing plate, which is transparent in a visible wavelength region, is provided in contact with the transparent electrode.

Still another means is the above-described light-emitting element wherein the sealing plate is provided by laminating a single layer or multiple layers of the optical thin film.

Still another means is the above-described light-emitting element wherein the optical thin film is composed of a metal oxide of $SiO_2$, $Al_2O_3$ or $TiO_2$, or a metal nitride of SiN or AlN as a base material.

Still another means is a light-emitting display device which uses the above-described light-emitting element with the above-described optical thin film(s) provided towards a plane from which a light is emitted.

Other objects, features and advantages of the invention will become apparent from the following description of the embodiments of the invention taken in conjunction with the accompanying drawings.

DESCRIPTION OF REFERENCE NUMERALS 1, 4, 54: Transparent glass board
2, 5: Optical thin film of low refractive index, containing pores
3: Nanometer-size pores
6: transparent electrode
7: Organic layer
8, 18, 28: Glass board or board having a thin-film transistor and circuit
9, 19, 39: Electrode of LiF/AlNd
10: Organic electron transport layer
11: Organic light-emitting layer
12, 22, 32: Organic hole transport layer
13, 23, 31: Organic hole injection layer
14, 24: Transparent electrode of indium zinc oxide
15, 26, 36, 41: Sealing glass plate
16, 27, 37, 43, 57: Sealing agent
17, 25, 29, 42: Optical thin film
20, 34: Organic electron transport layer
21, 33: Organic light-emitting layer
30, 44: Transparent electrode of indium tin oxide
35: Electrode of LiF/Al
38: Board having a thin-film transistor and circuit
40: Bank layer
45: Panel screen
46: circuit interconnection
47: Drive power source
48: Liquid-crystal display panel
49A, 49B: Polarizer plate
50A, 50B: Transparent board
51: Liquid-crystal layer
52: Sealing/fixing column
53: Organic electroluminescence device panel of the present invention for emitting white light
55: Organic electroluminescence layer for emitting white light
56: Transparent sealing plate

DETAILED DESCRIPTION OF THE INVENTION

The specific embodiments for carrying out the present invention are described below.

EXAMPLE 1

Figure 7:
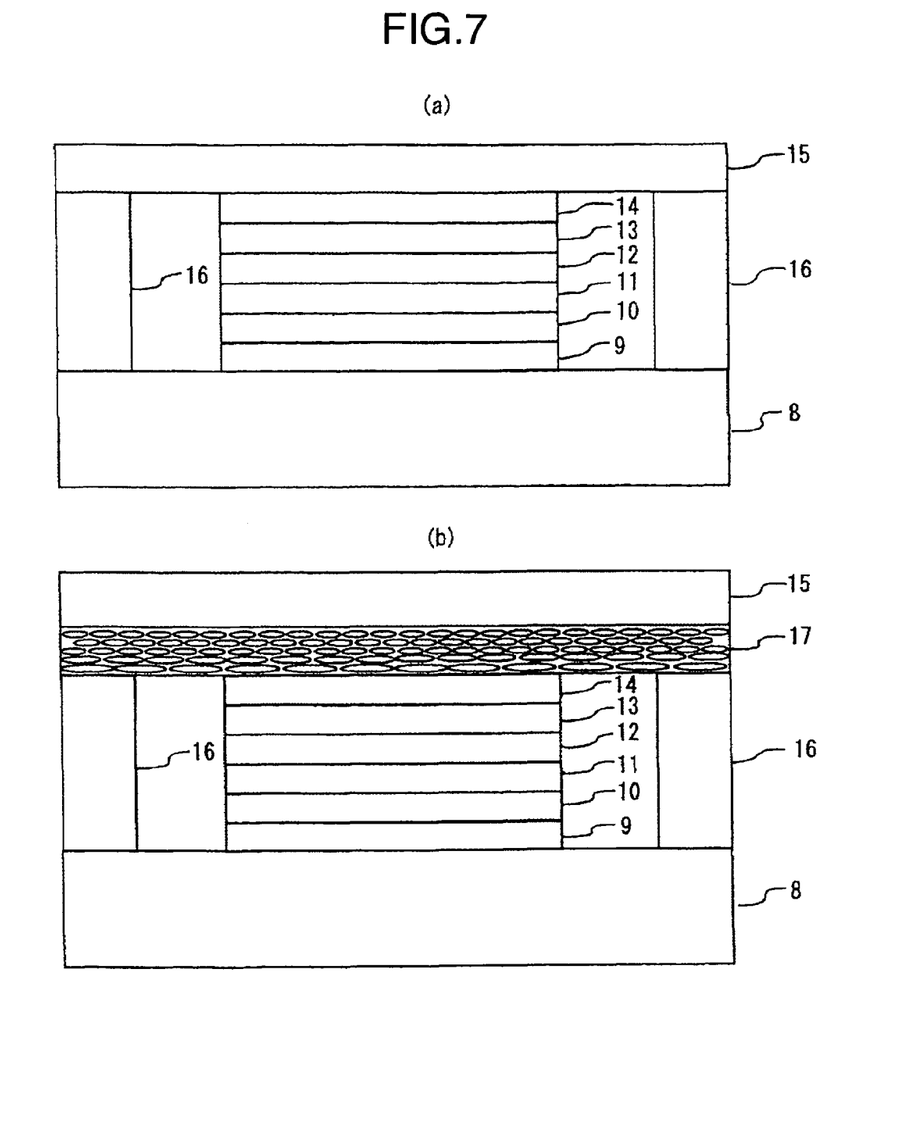
FIG. 7(a) is a cross-sectional view illustrating a top-emission type organic electroluminescence device free of optical thin film, to be compared with one embodiment of the present invention.
FIG. 7(b) is a cross-sectional view illustrating a top-emission type organic electroluminescence device as one embodiment of the present invention, provided with an optical thin film.

EXAMPLE 1 is described by referring to FIGS. 7(a) and (b). EXAMPLE 1 prepares an organic electroluminescence device of top-emission type, provided with the optical thin film 17 of low refractive index and containing pores (illustrated in FIG. 7(b)), to compare it with a common device free of porous optical thin film (illustrated in FIG. 7(a).

Referring to FIGS. 7(a) and (b), the organic electroluminescence device comprises the board 8 (glass board or board having a thin-film transistor and circuit), which supports patterns of the electrode 9 of LiF/AlNd, organic electron transport layer 10, organic light-emitting layer 11, organic hole transport layer 12, organic hole injection layer 13 and transparent electrode 14 of indium zinc oxide, where all of the layers except the indium zinc oxide electrode are provided by deposition. The sealing plate of the optical thin film 17 formed on the sealing glass plate 15 is prepared, where the optical thin film is prepared from silica-dispersed sol, colloidal silica and alcohol as the starting materials, and contains nanometer-size pores. The optical thin film is designed to contain nanometer-size pores, equivalent to or shorter than visible wavelengths, and have a refractive index of 1.3 or less in a range from 1.09 to 1.3, inclusive. Thickness of the optical thin film is set at around $\lambda/4$, where $\lambda$ is the central peak around the spectral peak of light emitted from the light-emitting layer. For the common organic electroluminescence device illustrated in FIG. 7(a), the sealing glass plate 15, free of optical thin film, is prepared and fixed by the sealing agent 16. In the organic electroluminescence device illustrated in FIG. 7(b), the sealing glass plate 15 of the optical thin film is fixed by the sealing agent 16 to contain the device in such a way to bring the optical thin film and transparent electrode 14 of indium zinc oxide (IZO) into contact with each other. The organic electroluminescence device of the present invention, illustrated in FIG. 7(b), is prepared by incorporating the optical thin film containing nanometer-size pores. The effects of the optical thin film for the present invention can be clarified by comparing the characteristics of these devices prepared in the same manner for the organic layer and electrode, which were deposited simultaneously.

Figure 8:
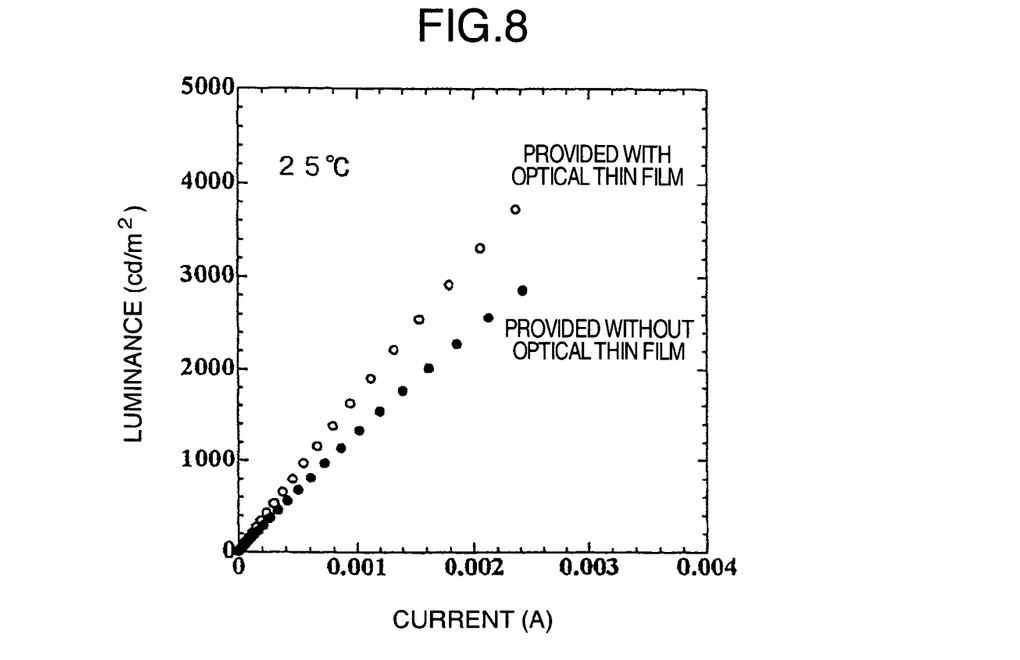
FIG. 8 shows the effect of optical thin film on the luminance-current characteristics of a device as one embodiment of the present invention.
Figure 9:
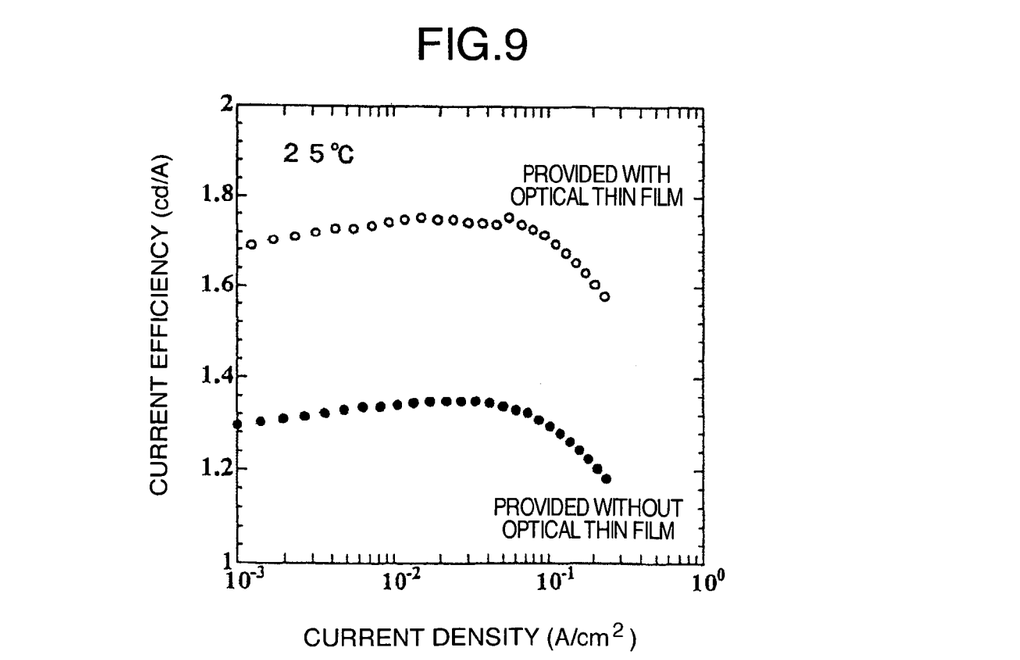
FIG. 9 shows the effect of optical thin film on the current efficiency-current density characteristics of a device as one embodiment of the present invention.
Figure 10:
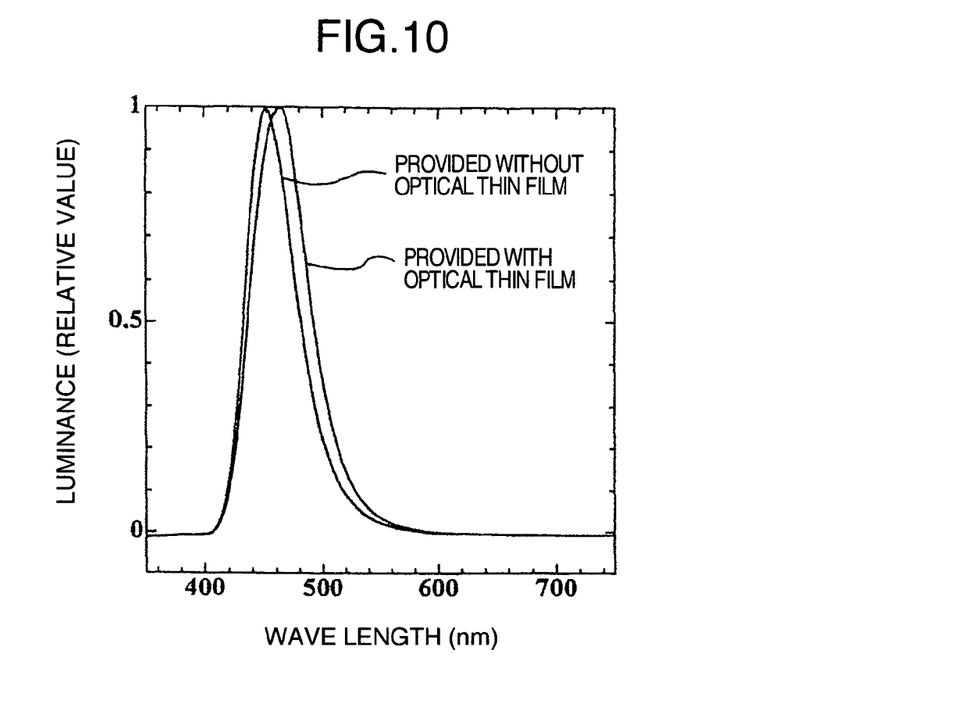
FIG. 10 shows the effect of optical thin film on the electroluminescent spectral pattern of a device as one embodiment of the present invention.

The structure of the organic electroluminescence device prepared in EXAMPLE 1, illustrated in FIG. 7(b), provides the following improved characteristics and effects by virtue of the optical thin film incorporated therein. First, the optical thin film prepared in EXAMPLE 1 is designed to have a thickness of 150 nm or less, equivalent to or shorter than visible wavelengths, and refractive index in a range from 1.20 to 1.25 (refer to FIG. 2). The film has a reflectance of 3 to 4% (transmittance: 96 to 97%). On the other hand, the sealing glass plate has a reflectance of 8 to 9% (transmittance: 91 to 92%). The optical thin film can work as an antireflective film, because of its low refractive index, and has a 7% higher transmittance than the sealing glass plate. Moreover, the optical thin film can not only enlarge a transmittance intensity, but also generates Mie scattered light because of containing nanometer-size pores and can effectively work to emit part of scattered light to the outside. It is found that the optical thin film can effectively reduce device operational current and power consumption by the tests carried out for estimating light extraction efficiency of these devices. The test results are described below. FIG. 8 shows the relationship between luminance and current for each device. As shown, the device incorporated with the optical thin film containing nanometer-size pores produces a higher luminance than the device free of optical thin film, 33% higher luminance at a current level of 2 mA. It should be noted that these devices exhibit exactly the same current-voltage characteristics. It is therefore concluded, based on these results, that the device incorporated with the optical thin film has a higher light-emitting efficiency than the device free of optical thin film at the same current and voltage levels. FIG. 9 shows the relationship between current efficiency and current density. As shown, the device incorporated with the optical thin film has an at least 30% higher current efficiency over the current density range tested. FIG. 10 compares the spectral patterns of light emitted from these devices at the same current level, plotting emitted light intensity against wavelength. As shown, no peculiar effect of the optical thin film on the spectral pattern is observed as a whole, although the pattern of light emitted from the device incorporated with the optical thin film shits to the long wavelength side to some extent.

Figure 11:
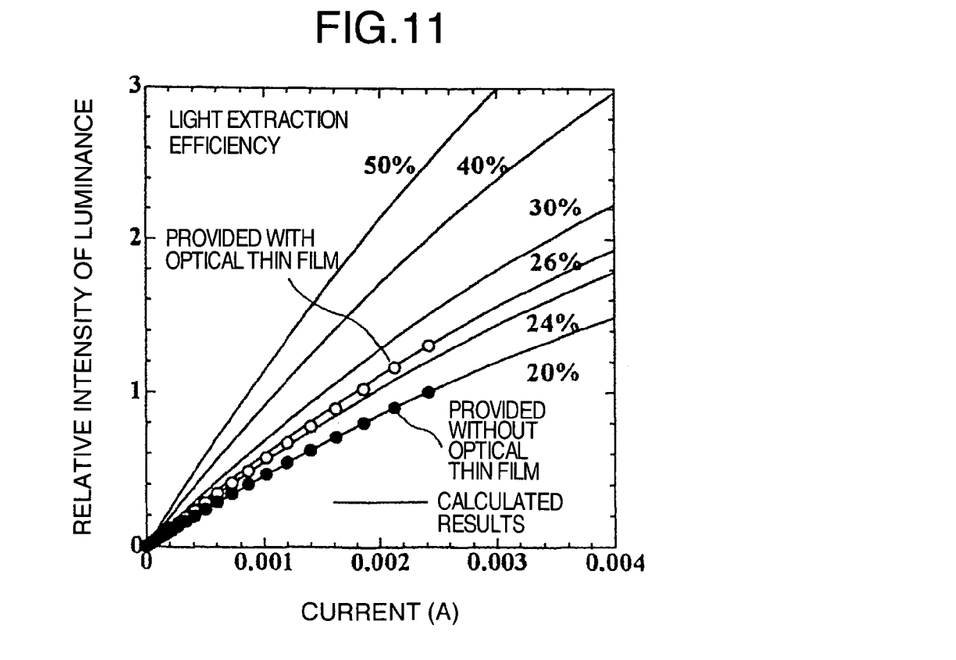
FIG. 11 shows the relative luminance-current characteristics of a device as one embodiment of the present invention with light extraction efficiency as a parameter, showing the effect of optical thin film.
Figure 12:
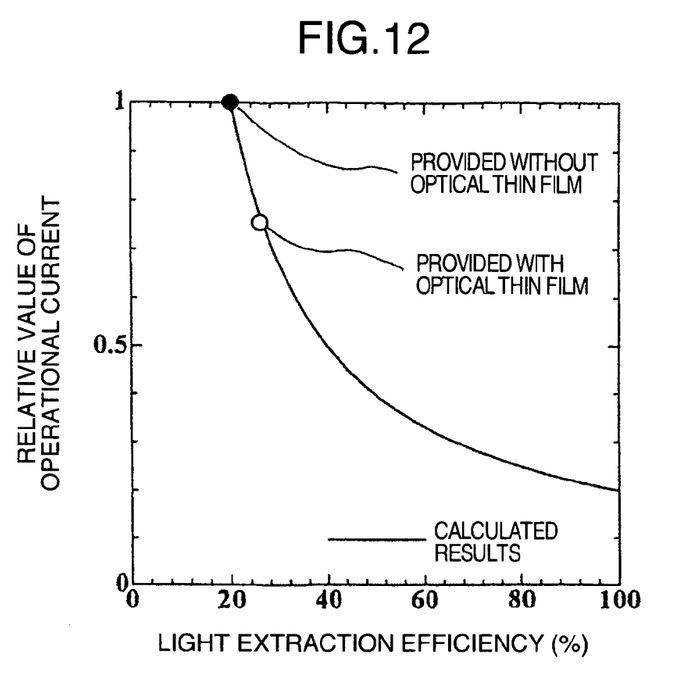
FIG. 12 shows the relationship between relative operational current and light extraction efficiency of a device as one embodiment of the present invention.
Figure 13:
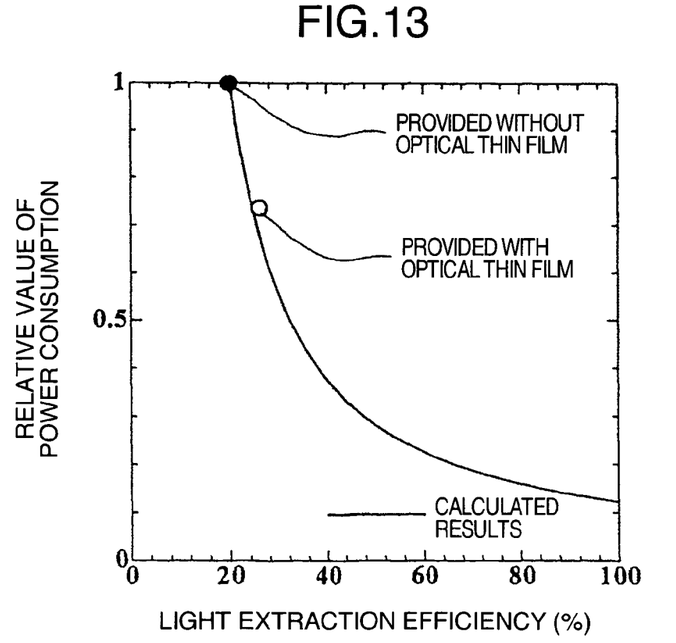
FIG. 13 shows the relationship between relative power consumption and light extraction efficiency of a device as one embodiment of the present invention.

FIGS. 11 to 13 show the test results for dependence of light extraction efficiency on luminance-current characteristics, operational current and power consumption, and compare the calculated results shown in respective FIGS. 4 to 6. Referring to FIG. 11, the test results are first fitted for the device free of optical thin film at a base light extraction efficiency of 20%. Based on these results, relative light extraction efficiency is calculated for the device incorporated with the optical thin film from the luminance-current characteristics as a function of light extraction efficiency. The results shown in FIG. 11 indicate that the optical thin film improves light extraction efficiency of the organic electroluminescence device to 26%, which is an increase to 1.3 times. FIGS. 12 and 13 plot relative operational current and power consumption against light extraction efficiency at an device luminance of 1000 $cd/cm^2$, to investigate the effects of the optical thin film for the tested devices. These results indicate that the optical thin film can reduce operational current by 25% and power consumption by 27% at the same luminance level. It is found that the results shown in FIGS. 11 to 13 are in good agreement with the calculated results, and that the effects of improved light extraction efficiency on reduction of required current and power consumption can be quantitatively estimated.

Moreover, the optical thin film prepared in EXAMPLE 1 is highly moisture-absorptive and efficiently absorbs moisture from the surface, and exhibits a function of gettering moisture in an atmosphere for sealing the organic electroluminescence device. Still more, it is highly antistatic because of its low surface resistivity of $10^{10}$ to $10^{11}$ $\Omega/cm^2$. A common insulating film has a high surface resistivity of $10^{15}$ to $10^{16}$ $\Omega/cm^2$. Therefore, charges of the ionic molecules which it absorbs tend to accumulate locally, and concentration of the ions which can be absorbed tends to be saturated in that region. By contrast, the optical thin film for the present invention is highly resistant to ambient conditions, as described above, and exhibits an effect of preventing deterioration of an organic film and electrode, which are sensitive to moisture or the like. As such, it can play an important role for securing reliability of the device in which it is used.

The optical thin film for the present invention may be of a single layer or laminate of 2 or more layers to adjust required properties, e.g., reflectance and moisture absorptivity, for specific purposes. Moreover, it may be formed on both sides of the sealing plate for the organic electroluminescence device to work as an antireflective film.

The top-emission type organic electroluminescence device of EXAMPLE 1 exhibits a higher current efficiency and around 30% higher light extraction efficiency for emitting light to the outside than the common device by virtue of the optical thin film, which draws scattered light out of light emitted by the light-emitting layer. EXAMPLE 1 also has demonstrated to what extent operational current and power consumption can be reduced, based on extent of improved light extraction efficiency.

EXAMPLE 2

Figure 14:
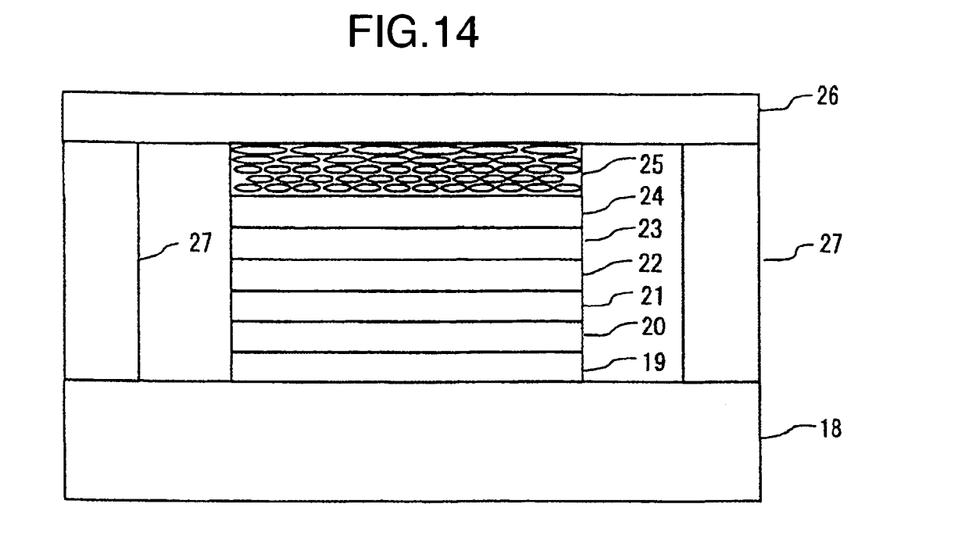
FIG. 14 is a cross-sectional view illustrating a top-emission type organic electroluminescence device as another embodiment of the present invention, provided with an optical thin film.

EXAMPLE 2 describes another embodiment of the present invention by referring to FIG. 14. EXAMPLE 2 also prepares an organic electroluminescence device of top-emission type, where the optical thin film containing nanometer-size pores is provided at a different position. More specifically, the organic electroluminescence device comprises, similar to that prepared in EXAMPLE 1, the board 18 (glass board or board having a thin-film transistor and circuit) which supports the electrode 19 of LiF/AlNd, organic electron transport layer 20, organic light-emitting layer 21, organic hole transport layer 22, organic hole injection layer 23 and transparent electrode 24 of indium zinc oxide, where all of the layers except the indium zinc oxide electrode are provided by deposition. Then, the optical thin film 25 for the present invention, prepared from silica-dispersed sol, colloidal silica and alcohol as the starting materials, is provided on the transparent electrode of indium zinc oxide, where the optical thin film is designed to contain nanometer-size pores, equivalent to or shorter than visible wavelengths, and have a refractive index of 1.3 or less in a range from 1.09 to 1.3, inclusive. Thickness of the optical thin film is set at around $\lambda/4$, where $\lambda$ is the central peak around the spectral peak of light emitted from the light-emitting layer. Then, the sealing glass plate 26 is fixed by the sealing agent 16 to contain the device in such a way to bring the sealing plate 26 and optical thin film into contact with each other.

The top-emission type organic electroluminescence device prepared in EXAMPLE 2 directly transmits light emitted from the light-emitting layer into the optical thin film to draw Mie scattering light upwards. This structure improves light extraction efficiency for emitting light to the outside from that of the device free of optical thin film, to an extent similar to that attained by the device prepared in EXAMPLE 1. The improved light extraction efficiency leads to reduced device operational current and power consumption.

EXAMPLE 3

Figure 15:
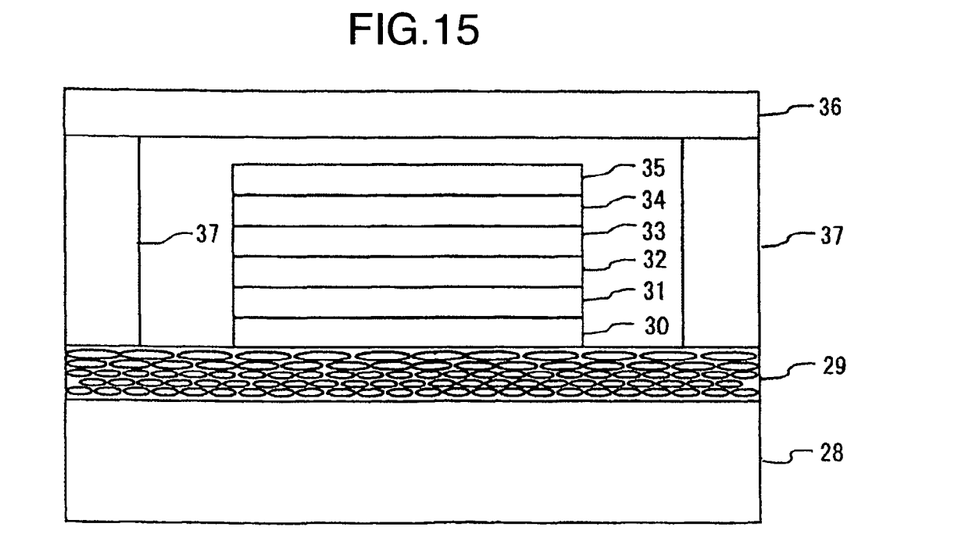
FIG. 15 is a cross-sectional view illustrating a bottom-emission type organic electroluminescence device as still another embodiment of the present invention, provided with an optical thin film.

EXAMPLE 3 describes still another embodiment of the present invention by referring to FIG. 15. EXAMPLE 3 prepares an organic electroluminescence device of bottom-emission type, where the optical thin film 29 containing nanometer-size pores, prepared from silica-dispersed sol, colloidal silica and alcohol as the starting materials, is provided on the board 28 (glass board or board having a thin-film transistor and circuit). Then, the board 28 is coated with the transparent electrode 30 of indium tin oxide, organic hole injection layer 31, organic hole transport layer 32, organic light-emitting layer 33, organic electron transport layer 34 and electrode 35 of LiF/AlNd. This structure is characterized by the optical thin film 29 coming into contact with the transparent electrode of indium tin oxide. Then, the sealing glass plate 36 is fixed by the sealing agent 37 to contain the device.

The bottom-emission type organic electroluminescence device prepared in EXAMPLE 3 directly transmits light emitted from the light-emitting layer into the optical thin film to draw Mie scattering light downwards. This structure improves light extraction efficiency for emitting light to the outside from that of the device free of optical thin film, to an extent at least equivalent to that attained by the device prepared in EXAMPLE 1. The improved light extraction efficiency leads to reduced device operational current and power consumption.

EXAMPLE 4

Figure 16:
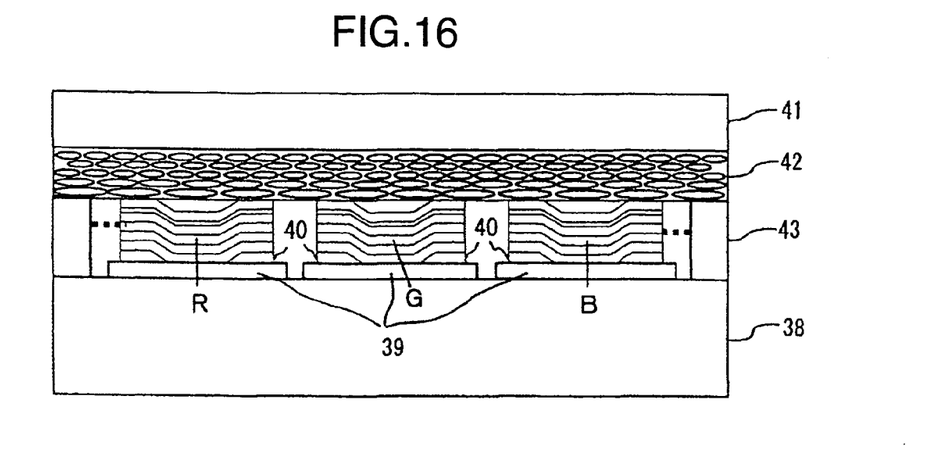
FIG. 16 is a cross-sectional view illustrating a top-emission type organic electroluminescence R, G and B pixels as another embodiment of the present invention, provided with an optical thin film.
Figure 17:
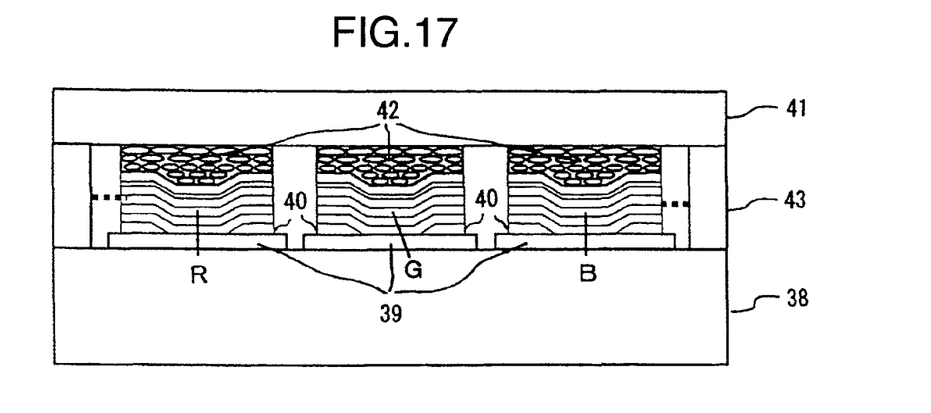
FIG. 17 is a cross-sectional view illustrating a top-emission type organic electroluminescence R, G and B pixels as another embodiment of the present invention, provided with an optical thin film.
Figure 18:
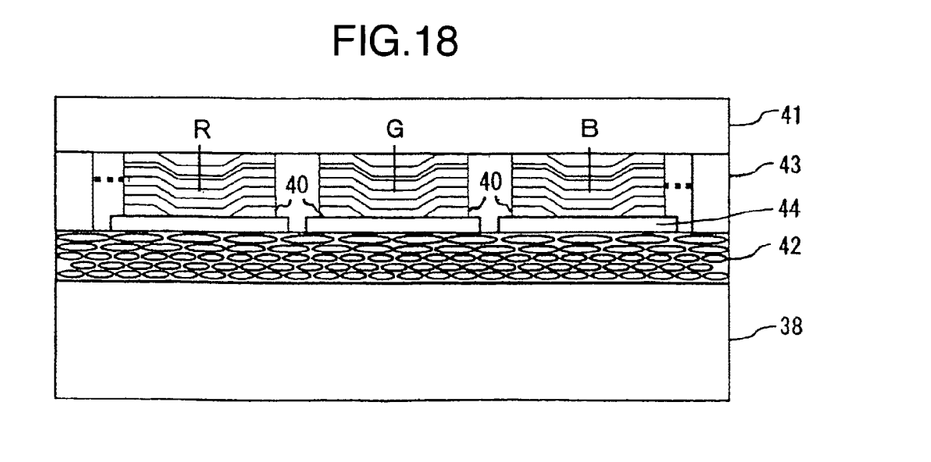
FIG. 18 is a cross-sectional view illustrating a bottom-emission type organic electroluminescence R, G and B pixels as another embodiment of the present invention, provided with an optical thin film.

EXAMPLE 4 describes still another embodiment of the present invention by referring to FIGS. 16 to 18. Referring to FIGS. 16 and 17, R, G and B pixels are formed by top-emission type organic electroluminescence devices for a display. The electrode 39 of LiF/AlNd is provided for each of the R, G and B pixels on the board 38 having a thin-film transistor and circuit, and the bank layer 40 is provided to form each of the R, G and B pixels and separate them from each other. Then, an organic layer as the light-emitting layer, composed of a material selected to emit wavelengths for red, green or blue light, is provided by deposition in a manner similar to that for EXAMPLE 1 or 2, to form the R, G or B pixels, as illustrated. Then, the sealing plate of the optical thin film 42 formed on the sealing glass plate 41 is prepared in a manner similar to that for EXAMPLE 1, as illustrated in FIG. 16, where the optical thin film is prepared from silica-dispersed sol, colloidal silica and alcohol as the starting materials, and contains nanometer-size pores. The sealing glass plate 41 on which the optical thin film 42 is formed is fixed by the sealing agent 43 to contain the device in such a way to bring the optical thin film and transparent electrode of indium zinc oxide into contact with each other. In FIG. 17, the optical thin film 42 containing nanometer-size pores is provided on the transparent electrode of indium zinc oxide in a manner similar to that for EXAMPLE 2, and the sealing glass plate 41 is fixed by the sealing agent 43 to contain the device in such a way to bring the sealing glass plate 41 and optical thin film 42 into contact with each other.

FIG. 18 illustrates R, G and B pixels formed by bottom-emission type organic electroluminescence devices for a display. Referring to FIG. 18, the optical thin film 42 containing nanometer-size pores, prepared from silica-dispersed sol, colloidal silica and alcohol as the starting materials, is provided on the board 38 having a thin-film transistor and circuit. Then, the board 38 is coated with the transparent electrode 44 of indium tin oxide, and the bank layer 40 is provided to form each of the R, G and B pixels and separate them from each other. Then, an organic layer as the light-emitting layer, composed of a material selected to emit wavelengths for red, green or blue light, is provided by deposition in a manner similar to that for EXAMPLE 3, to form each of the R, G or B pixels, as illustrated, and the sealing glass plate 41 is fixed by the sealing agent 43 to contain the device.

Each of the R, G and B pixels, composed of the top-emission type or bottom-emission type organic electroluminescence device directly transmits light emitted from the light-emitting layer into the optical thin film to draw Mie scattering light. This structure improves light extraction efficiency for emitting light to the outside from that of the device free of optical thin film, to an extent at least equivalent to that attained by the device prepared in EXAMPLE 1. The improved light extraction efficiency leads to reduced operational current and power consumption at each pixel, producing an effect of reducing power consumption of the display. Therefore, it can realize a display, high in efficiency and reliability, and stably serviceable for extended periods.

EXAMPLE 5

Figure 19:
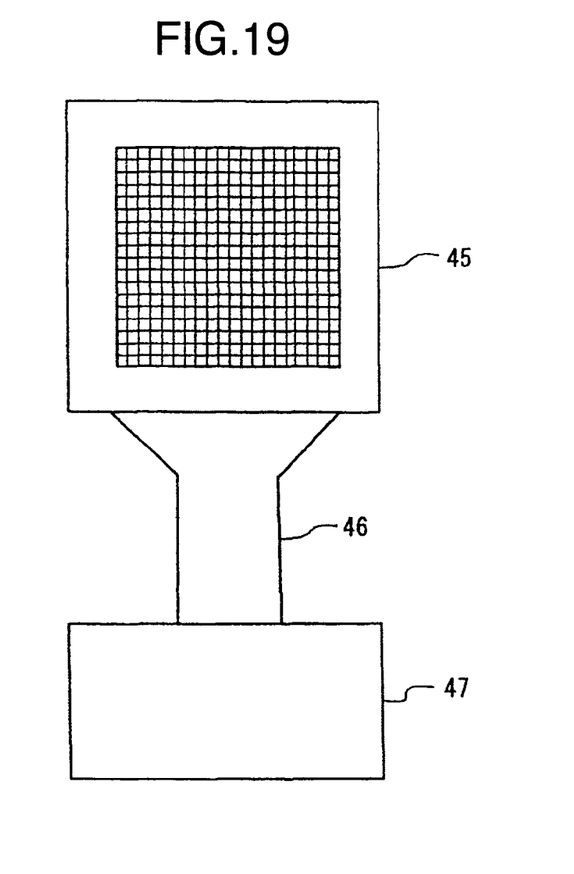
FIG. 19 illustrates a display incorporated with the device of the present invention.

EXAMPLE 5 describes still another embodiment of the present invention by referring to FIG. 19. The panel screen 45 is prepared using the organic electroluminescence device prepared in one of EXAMPLES 1 to 4 as the pixel for the display, where each pixel is driven by the drive power source 47 via the circuit interconnection 46. Each of the R, G and B pixels improves light extraction efficiency from that of the device free of optical thin film. The improved light extraction efficiency leads to reduced operational current and power consumption at each pixel, producing an effect of reducing power consumption of the display. Therefore, it can realize a display, high in efficiency and reliability, and stably serviceable for extended periods.

EXAMPLE 6

Figure 20:
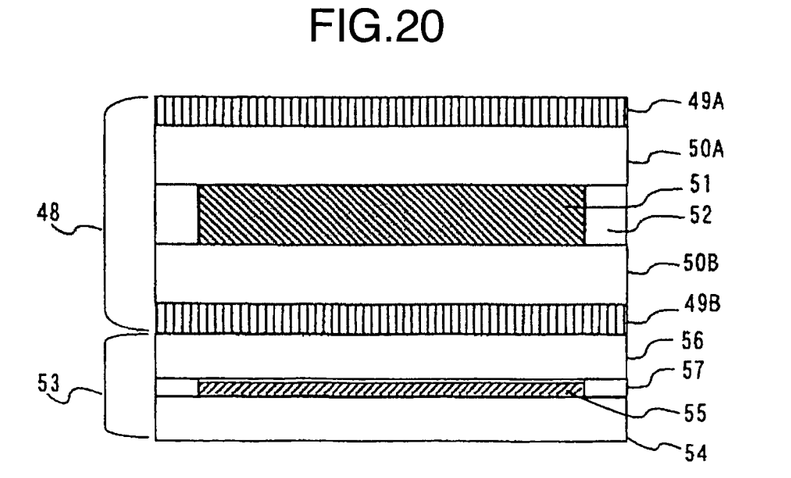
FIG. 20 illustrates a liquid-crystal display incorporated with the organic luminescence device as one embodiment of the present invention for emitting white back light.
Figure 21:
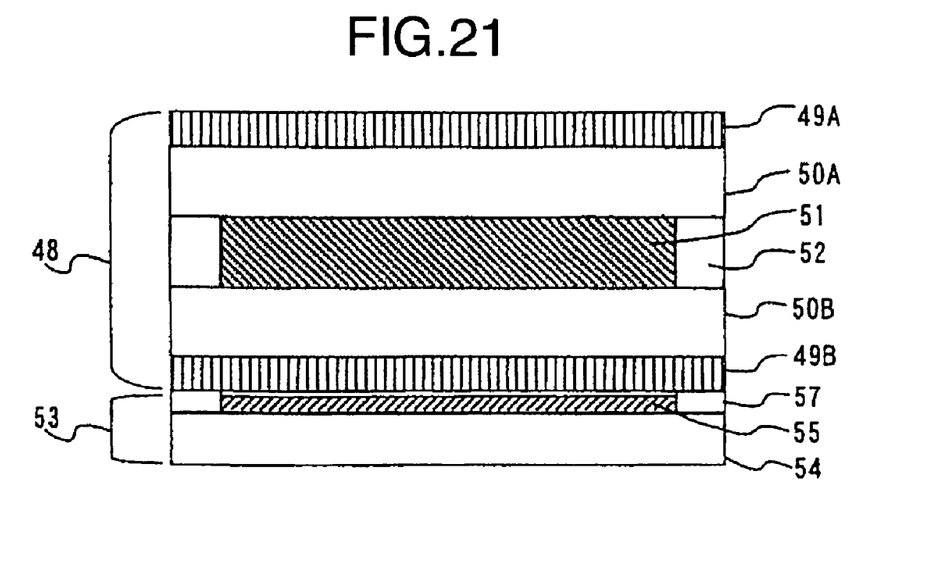
FIG. 21 illustrates a liquid-crystal display incorporated with the organic luminescence device as another embodiment of the present invention for emitting white back light.

EXAMPLE 6 describes still another embodiment of the present invention by referring to FIGS. 20 and 21. EXAMPLE 6 applies the optical thin film for the present invention to the light-emitting layers which produce white light by mixing different light colors for an organic electroluminescence device. This makes the organic electroluminescence device emitting white light applicable to a back light for liquid-crystal displays.

Referring to FIG. 20, EXAMPLE 6 prepares a display panel module comprising the panel 48 for a liquid-crystal display is put on the organic electroluminescence panel 53 emitting white light, where the optical thin film for the present invention is used in the panel 53. The liquid-crystal display panel 48 comprises the liquid-crystal layer 51 set between the transparent boards 50A and 50B, which are coated with the respective polarizer plates 49A and 49B, in a space defined by the sealing/fixing column 52. It controls transmission of light, when a voltage is applied to the liquid-crystal layer 51. The organic electroluminescence panel 53 emitting white light, in which the optical thin film for the present invention is used, comprises the organic electroluminescence layer 55, provided on the transparent glass board 54, and transparent sealing plate 56 fixed by the sealing agent 57. The organic electroluminescence panel 53 may be directly put on the liquid-crystal display panel 48 by the sealing agent 57 with the transparent sealing plate 56 removed, as illustrated in FIG. 21. A thin-film transistor as the switch for applying an electric field to the liquid-crystal layer 51 and interconnections for voltage supply are not shown. It is needless to say that color display can be realized when a color filter is provided inside of the board.

The organic electroluminescence device of EXAMPLE 6 for emitting white light can be structured to illuminate the entire liquid-crystal display panel surface with white back light. It provides an unprecedentedly thin back light source and liquid-crystal display incorporated therewith. A liquid-crystal display panel of a conventional technique is illuminated with back light from a point light source of an inorganic diode emitting white light. However, it needs a space of certain distance between the white back light source module and liquid-crystal display panel to help radiate light from the point source. The organic electroluminescence panel of EXAMPLE 6 for emitting white light, capable of illuminating the entire surface, can be directly put on the liquid-crystal display panel, thus dispensing with the above-described space. An inorganic diode by a conventional technique for emitting white light uses wave-guided light, and needs a wave-guiding plate, reflective plate and optical sheet. As a result, the back light source becomes 1.0 to 2.0 mm thick. By contrast, the organic electroluminescence panel 53 can have a thickness reduced to 0.6 to 0.9 mm (FIG. 20), or to 0.3 to 0.6 mm (FIG. 21).

When used for emitting back light for liquid-crystal displays, the organic electroluminescence device of EXAMPLE 6 for emitting white light can reduce power requirement from that consumed by a conventional inorganic diode. Moreover, the electroluminescence device, incorporated with the optical thin film for the present invention, improves light extraction efficiency and can enhance light output for illuminating the entire surface at a lower current than that of a device free of optical thin film. Therefore, it realizes device characteristics of improved light-emitting efficiency and current efficiency. It can reduce operational current and power consumption at the organic electroluminescence device for emitting white light, and consequently reduce power consumption at the back light source. As such, it can reduce total power consumption at the device in which it is incorporated, e.g., cellular phone, information terminal or digital video camera. Therefore, it can realize a display, serviceable for extended periods stably and reliably.

INDUSTRIAL APPLICABILITY

The present invention is applicable to an organic electroluminescence device and illuminator of high efficiency and low power consumption, light source, e.g., diode emitting white light and back light device for liquid crystals, and display of high reliability and wide viewing angle.

Advantages of the Invention

The device of the present invention is incorporated with an optical thin film of low refractive index and containing nanometer-size pores. It is found that it can realize a higher light extraction efficiency than a conventional device, because the optical thin film scatters part of light it receives from a light-emitting layer by Mie scattering upwards and then to the outside, where Mie scattering occurs in its pores having a size equivalent to wavelengths of light which they transmit. The optical thin film is confirmed to improve light extraction efficiency by around 30%, thereby reducing required operational current and power consumption by 25 and 27%, respectively. Moreover, the optical thin film of low refractive index for the present invention is optically stable, stably realizes the above-described optical characteristics, and hence exhibits an effect of efficiently improving electrical characteristics. Still more, the optical thin film applied to the present invention is highly moisture-absorptive, antistatic to prevent local accumulation of charges, and hence resistant to ambient conditions. As such, it can exhibit a function of preventing deterioration of an organic film and electrode as the device components, and hence contribute to improved device reliability.

The optical thin film for the present invention may be of a single layer or laminate of 2 or more layers, as illustrated in FIG. 3, to adjust required properties, e.g., reflectance and moisture absorptivity, for specific purposes. Moreover, it may be formed on both sides of the sealing plate for an organic electroluminescence device to work as an antireflective film.

The optical thin film for the present invention is also effective, when applied to an organic luminescence device emitting white light, and also to a blue-emitting layer incorporated with a layer for emitting yellowish brown color and to a layer emitting blue, green and red colors as the three primary colors.

The embodiments of the present invention describe the optical thin film prepared from silica ($SiO_2$) as one of the starting materials. However, other oxides or nitrides may be used so long as they are dielectric and insulating. The dielectric materials useful for the present invention include metal oxides represented by $Al_2O_3$ and $TiO_2$, and metal nitrides represented by SiN and AlN.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A light-emitting element comprising:
a board;
a first electrode;
a second electrode;
a light-emitting layer placed between the first electrode and second electrodes; and
an optical thin film,
wherein the optical thin film is composed of a dielectric material as a base material and has nanometer size pores, of which proportion based on the optical thin film is changing in a film thickness direction of the optical thin film,
wherein the pores have a size of major axis changing in the thickness, direction of the optical thin film and the size of the major axis increases towards a plane from which a light is emitted from the optical thin film.

2. A light-emitting element comprising:
a board;
a first electrode;
a second electrode;
a light-emitting layer placed between the first electrode and second electrodes; and
an optical thin film,
wherein the optical thin film is composed of a dielectric material as a base material and has nanometer size pores, of which proportion based on the optical thin film is changing in a film thickness direction of the optical thin film,
wherein the pores have a major axis running in parallel to a plane from which a light is emitted from the optical thin film, and a length of the major axis increases in the thickness direction towards the plane.

3. A light-emitting element comprising:
a board;
a first electrode;
a second electrode;
a light-emitting layer placed between the first electrode and second electrodes; and
an optical thin film,
wherein the optical thin film is composed of a dielectric material as a base material and has nanometer size pores, of which proportion based on the optical thin film is changing in a film thickness direction of the optical thin film,
wherein the optical thin film has a surface resistivity of $10^{10}$ to $10^{11}$ $\Omega/cm^2$, inclusive.

4. A light-emitting element comprising:
a board;
a first electrode;
a second electrode;
a light-emitting layer placed between the first electrode and second electrodes; and
an optical thin film,
wherein the optical thin film is composed of a dielectric material as a base material and has pores, of which proportion based on the optical thin film is changing in a film thickness direction of the optical thin film,
wherein the pores have a diameter of 5 to 700 nm, inclusive, and are structured to emit a light due to Mie scattering, which is generated when a light emitted from the light-emitting layer hits the pores, to an outside of the element.

5. The light-emitting element according to claim 4, wherein the optical thin film has a refractive index distribution in the thickness direction.

6. The light-emitting element according to claim 4, which is composed of an organic material of an organic low-molecular-weight or high-molecular-weight material, and contains the optical thin film stacked towards a light extraction plane of the light-emitting layer, from which electroluminescence is emitted.

7. The light-emitting element according to claim 4, wherein the first electrode or the second electrode is transparent electrode and is provided in contact with the optical thin film.

8. The light-emitting element according to claim 4, wherein the optical thin film is composed of a metal oxide of $SiO_2$, $Al_2O_3$ or $TiO_2$, or a metal nitride of SiN or AlN as a base material.

9. A light-emitting display device which uses the light-emitting element according to claim 4 with the optical thin film provided towards a plane from which a light is emitted.

10. A light-emitting element comprising:
a board;
a first electrode;
a second electrode;
a light-emitting layer placed between the first electrode and second electrodes; and
an optical thin film,
wherein the optical thin film is composed of a dielectric material as a base material and has nanometer size pores, of which proportion based on the optical thin film is changing in a film thickness direction of the optical thin film,
wherein a thickness of the optical thin film is half or less of a peak wavelength of visible light transmitted by the film.

11. A light-emitting element comprising:
a board;
a first electrode;
a second electrode;
a light-emitting layer placed between the first electrode and second electrodes; and
an optical thin film,
wherein the optical thin film is composed of a dielectric material as a base material and has nanometer size pores, of which proportion based on the optical thin film is changing in a film thickness direction of the optical thin film,
wherein the optical thin film is composed of plural films stacked in layers, each layer having a thickness of 10 to 700 nm, inclusive.

* * * * *